United States Patent
Ma

[11] Patent Number: 6,133,802
[45] Date of Patent: Oct. 17, 2000

[54] SYNCHRONOUS CARRIER RECOVERY CIRCUIT AND INJECTION LOCKED OSCILLATOR

[75] Inventor: Zhigang Ma, Allentown, Pa.

[73] Assignee: Lucent Technologies Inc., Murray Hill, N.J.

[21] Appl. No.: 09/016,275

[22] Filed: Jan. 30, 1998

Related U.S. Application Data

[60] Provisional application No. 60/072,602, Jan. 26, 1998.

[51] Int. Cl.[7] .............................. H03B 5/36; H03D 3/00; H03D 3/02; H03L 7/24
[52] U.S. Cl. ..................................... 331/172; 331/116 FE; 331/158; 329/324; 329/346; 375/326; 455/255
[58] Field of Search .................................. 331/34, 116 R, 331/116 FE, 117 R, 117 FE, 117 D, 158, 172, 177 R; 332/117, 135; 329/302, 306, 324, 346, 359; 375/326; 455/255, 318–322

[56] References Cited

U.S. PATENT DOCUMENTS

| | | | |
|---|---|---|---|
| 3,794,760 | 2/1974 | Moriki | 178/69.5 N |
| 4,064,468 | 12/1977 | Kumata | 331/116 R |
| 5,075,643 | 12/1991 | Einbinder | 332/135 |
| 5,650,749 | 7/1997 | Main | 329/324 |

*Primary Examiner*—David Mis

[57] ABSTRACT

A simple carrier recovery circuit capable of accurately detecting and synchronizing an incoming carrier frequency without the use of a phase locked loop (PLL) is provided. Instead of a PLL, the carrier recovery circuit includes an injection locked oscillator. The injection locked oscillator includes an input for connection to the received modulated signal. The gain of an inverter stage of a amplifier in the injection locked oscillator is modulated by the received modulated signal using an injection transistor connected between the power source and the output of the inverter stage. The gate of the injection transistor receives a signal corresponding to the received modulated signal.

21 Claims, 3 Drawing Sheets

SYNCHRONOUS CARRIER RECOVERY CIRCUIT AND INJECTION LOCKED OSCILLATOR

This application is related to and claims priority from a U.S. provisional application, Ser. No. 60/072,602, filed Jan. 26, 1998, now abandoned, the entirety of which is explicitly incorporated herein by reference.

BACKGROUND OF THE INVENTION

1. Field of the Invention

This invention relates to carrier signal recovery, and more particularly to an injection locked oscillator for use with a carrier recovery circuit.

2. Background of Related Art

Radio signals are utilized in many wireless applications for carrying an information signal from a transmitter to a receiver. Often the underlying information signal being transmitted is modulated for transmission at radio frequencies. Many modulation techniques exist for radio frequency (RF) communications, e.g., amplitude modulation (AM), frequency modulation (FM), and quadrature amplitude modulation (QAM). In most modulation techniques, a carrier signal is required to carry the information signal, whether it be modulated in amplitude, frequency, and/or phase.

For instance, in FM, the information signal is added to or frequency modulated (FM) with the carrier signal, and amplified for transmission to the receiver. The transmitted signal thus comprises the original information signal impressed upon a predetermined carrier frequency, which may be any value, e.g., 10, 100 or 200 megahertz (MHz).

A carrier recovery circuit in the receiver detects and demodulates the received modulated signal by subtracting the carrier frequency from the received modulated signal to result in the original information signal at the receiver. This is a well known technique which requires that the exact carrier frequency be known and recreated at the receiver.

Two basic techniques are utilized to generate the carrier frequency at the receiver: either the carrier signal is generated locally at an expected frequency, or it is sensed based on the incoming modulated signal. In theory either technique can result in an accurate recreation of the carrier frequency at the receiver. However, real world conditions result in variances caused between the actual carrier frequency as ultimately received by the receiver, and the receivers locally generated or recreated carrier frequency. For instance, electronics are affected by temperature variations. Thus, as the transmitter or receiver varies in temperature (e.g., as it is taken outside, or as it warms up when it is first turned on), the actual carrier frequency and that generated at the receiver will vary from one another, resulting in a less than accurate demodulation of the modulated signal at the receiver, and thus a less than accurate recovery of the information signal at the receiver.

In the first technique, a locally generated carrier frequency is typically provided based on a crystal oscillator having a frequency equal to the expected carrier frequency. FIG. 4 shows the details of such a conventional crystal oscillator.

In FIG. 4, a crystal oscillator typically requires power and ground, and provides a predetermined clock frequency output. Some conventional devices further include an enable signal input for halting operation of the crystal oscillator (and perhaps external clocked circuitry).

The enable signal is inverted by an inverter 508, to connect a power source to inverter 500. The basis for the crystal oscillator is a small signal gain amplifier 550 formed by resistors 510, 514 and 512, and inverter 500. The frequency output of the amplifier is controlled by the value of crystal 516. The value of capacitors 502 and 504 connected between opposite nodes of the crystal 516 and ground depends on the chosen frequency. Buffer 506 amplifies the small signal output from the amplifier 550 (e.g., 500 millivolt (mV) logic) to higher voltage logic (e.g., 3 V logic).

Unfortunately, the locally generated oscillator must be an extremely stable oscillator, and extremely accurate to the center frequency of the transmitted carrier frequency. Even so, a locally generated carrier signal is not conventionally capable of sensing drift in the actual received modulated signal.

Locally generated carrier signals require a priori knowledge of the carrier frequency, and must be as accurate and stable as possible. Unfortunately, locally generated carrier signals suffer from a susceptibility to phase errors which degrade the demodulation performance of the carrier recovery circuit. For instance, a delay between the sensing of the modulated signal and a recreation of the carrier frequency often causes a phase delay deteriorating frequency synchronization between the carrier frequency and the recreated carrier frequency in the receiver. Thus, the receiver must recreate the exact frequency and phase of the carrier signal to avoid degradation of the demodulated information signal.

The second technique for generating a carrier frequency at the receiver is shown in FIG. 5. FIG. 5 shows the use of a phase-locked loop (PLL) 400 to sense a frequency and phase of the carrier frequency in the incoming modulated signal. FIG. 5 shows a conventional carrier and clock recovery circuit including a PLL. The PLL 400 provides a phase and frequency corrected recovered carrier signal to the phase/frequency detector 102 for comparison with the actually received modulated signal (which due to real world conditions contains noise in the form of phase and frequency variations).

In FIG. 5, a phase/frequency detector 102 receives both the incoming modulated signal on line 420 and the output of the PLL 400 at point 422. The phase/frequency detector 102 compares the phase and frequency of the received modulated signal on line 420 with the phase and frequency generated by the PLL 400 to detect the actual phase and frequency of the carrier frequency as is it is received in the receiver. This accurately determined carrier frequency is subtracted from the received modulated signal to result in an output of the recovered information signal.

In more detail, the received modulated signal is input to the PLL 400 at line 420. A band pass filter 408 band pass filters the input modulated signal such that sideband information beyond that desired is eliminated. A phase detector 406, charge pump 404 and loop filter 402 provide a comparative phase for the received modulated signal and the locally sensed carrier frequency, and generate a DC signal for control of a voltage controlled oscillator (VCO) 430. The VCO 430 outputs a particular frequency based on the voltage level of its control input.

While having certain advantages, the inclusion of a PLL in a carrier recovery circuit adds complexity and cost to a receiver. This is particularly of concern in lower end applications such as low end cordless telephones or other 10–100 MHz low power, wireless applications. Moreover, the inclusion of a PLL slows the acquisition time necessary to acquire phase lock with changes in the modulated signal, and thus limits the frequency, modulation, and overall performance of the receiver.

There is thus the need to provide a simple carrier recovery circuit which is capable of accurately and quickly detecting and regenerating the carrier frequency, in particular without requiring a PLL.

SUMMARY OF THE INVENTION

In accordance with one aspect of the present invention, an injection locked oscillator is provided which comprises an inverter stage, and a crystal connected across the inverter stage to establish a nominal oscillation of the injection locked oscillator. The injection locked oscillator further includes an injection transistor connected to the inverter stage to control a gain of the inverter stage in accordance with an externally input modulated signal.

In a larger aspect of the present invention, a synchronous carrier recovery circuit is provided, comprising an injection locked oscillator and a phase/frequency detector. The phase/frequency detector includes two inputs and an output. The phase/frequency detector compares a frequency and phase of a first signal on a first input to a frequency and phase of a second signal on a second input, and outputs a difference between the first signal and the second signal. The injection locked oscillator includes a crystal oscillator and an injection circuit. The incoming carrier signal injects into the oscillator through the injection circuit, modulating the oscillator frequency.

A method of injecting a modulation signal into a crystal oscillator in accordance with the principles of the present invention provides a crystal oscillator, and modulates a gain of the crystal oscillator based on an injected modulation signal.

BRIEF DESCRIPTION OF THE DRAWINGS

Features and advantages of the present invention will become apparent to those skilled in the art from the following description with reference to the drawings, in which.

DETAILED DESCRIPTION OF ILLUSTRATIVE EMBODIMENTS

The present invention provides an injection locked oscillator, a specially designed CMOS oscillator that can be used for carrier recovery. The use of the injection locked oscillator eliminates the need for a PLL in a carrier recovery circuit which synchronizes with an incoming carrier signal. The injection locked oscillator functions as an adaptive high Q band-pass filter which is capable of following drift in the incoming carrier signal so that synchronization can be achieved.

The disclosed embodiment of an injection locked oscillator forms a crystal oscillator tuned to the expected center frequency of the carrier signal. Importantly, the injection locked oscillator includes a synchronizing input corresponding to the received signal. The present invention, while in no way limited to any particular carrier signal, is especially suitable for use with low end cordless telephones and other 10 to 100 or 200 MHz low power, wireless applications.

Figure 1:
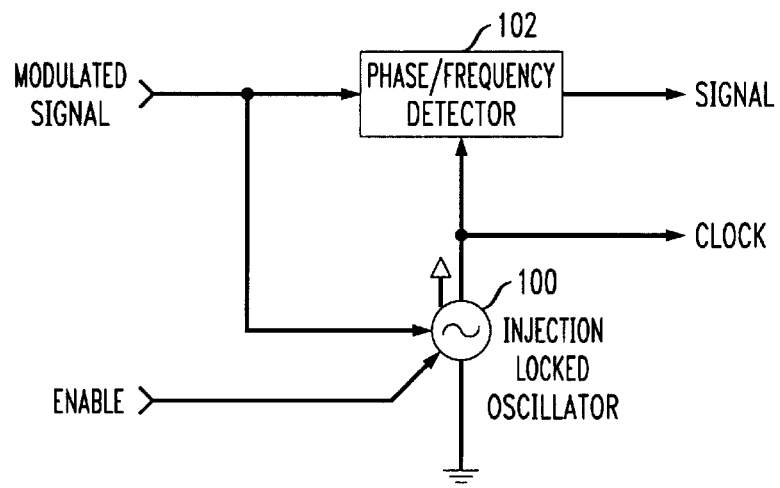
FIG. 1 shows a synchronized carrier frequency recovery circuit including an injection locked oscillator in accordance with the principles of the present invention.

FIG. 1 shows a synchronized carrier frequency recovery circuit including an injection locked oscillator 100 in accordance with the principles of the present invention. This described embodiment utilizes 3 volt output logic levels in 0.35 micrometer ($\mu$m) CMOS technology.

In FIG. 1, a conventional phase/frequency detector 102 compares the frequency and phase of an incoming modulated signal to the synchronized frequency and phase of a locally generated carrier frequency from the injection locked oscillator 100. Of particular note in FIG. 1 is that there is no PLL in the synchronous carrier recovery circuit.

The injection locked oscillator 100 is enabled by an enable signal in the conventional fashion, and outputs a clock signal which is synchronized to the input modulated signal. Power and ground are also provided to the injection locked oscillator 100. Uniquely, and importantly, the injection locked oscillator 100 provides for the direct input of the received modulated signal.

Figure 2:
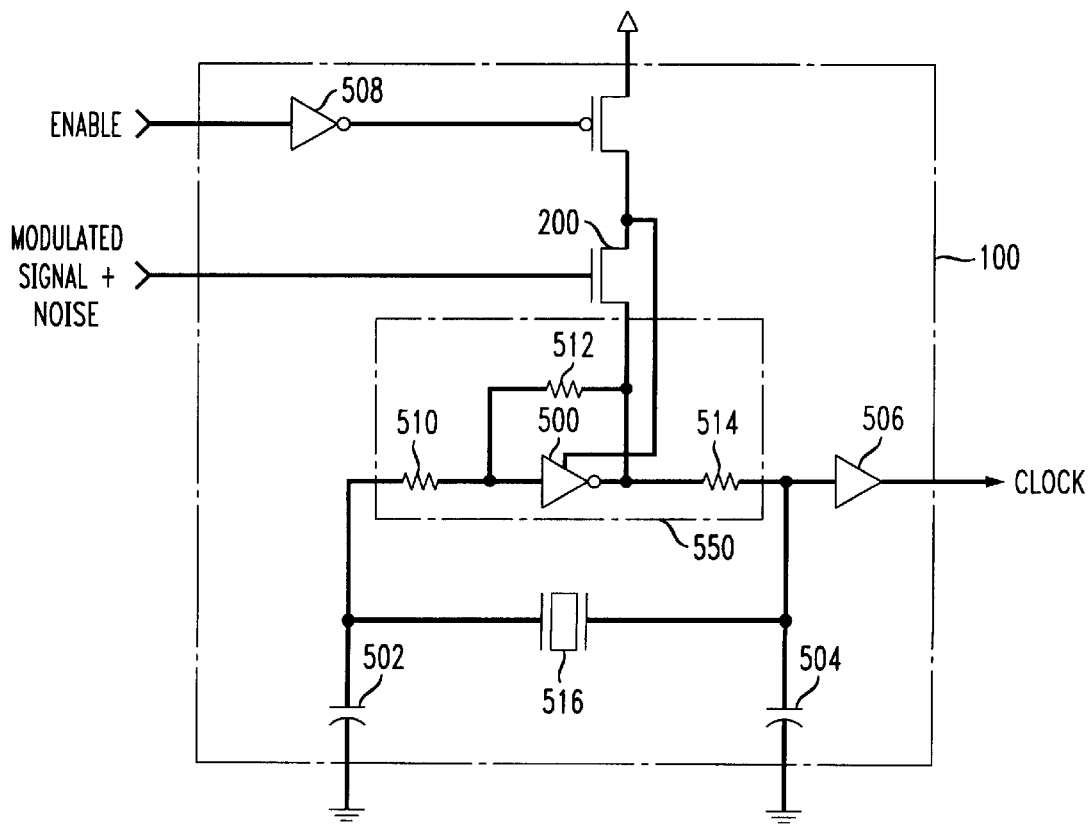
FIG. 2 is a more detailed schematic diagram of an embodiment of an injection locked oscillator as shown in FIG. 1.

FIG. 2 is a more detailed schematic diagram of the injection locked oscillator 100 shown in FIG. 1. The injection locked oscillator 100 includes a small signal amplifier stage 550. The amplifier comprises an inverter 500 with a resistor 510 serially connected to its input and a resistor 514 serially connected to its output. The values of resistors 510 are conventionally determined and based on the desired gain of the amplifier 550, and also on the load of crystal 516. In the disclosed embodiment, resistors 510 and 514 are approximately 500 ohms each.

A feedback circuit is formed by a resistive element 512 connected between the input and output of the inverter 500. The resistive element 512 biases the inverter 500 at the desired operation point by controlling the current drive and gain of the inverter 500. In the disclosed embodiment, the resistive element 512 is formed by two serially connected FET transistors, and has an effective resistance in the 10 K ohm range.

Figure 4:
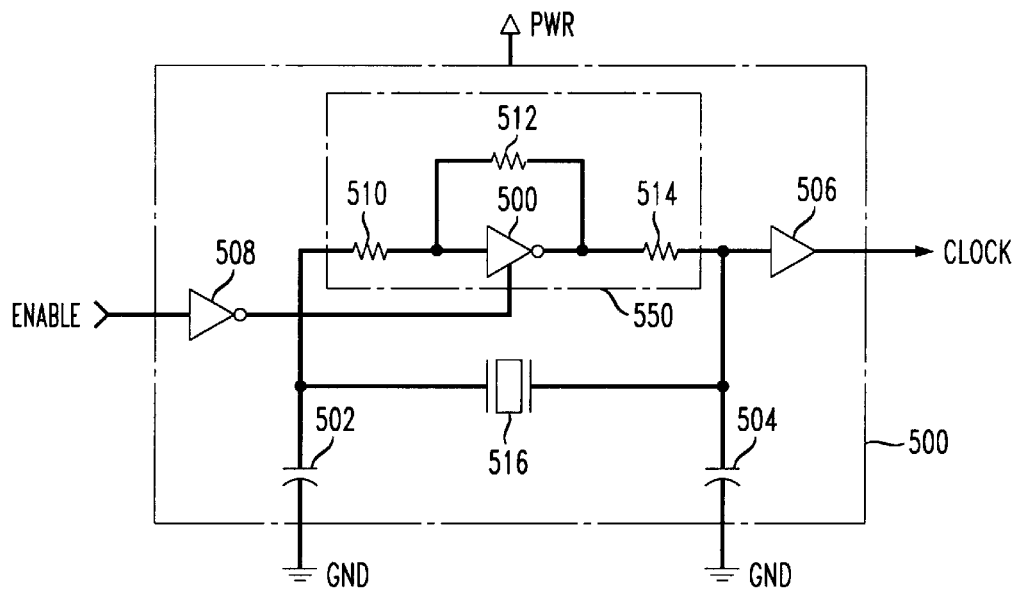
FIG. 4 shows a conventional crystal oscillator.
Figure 5:
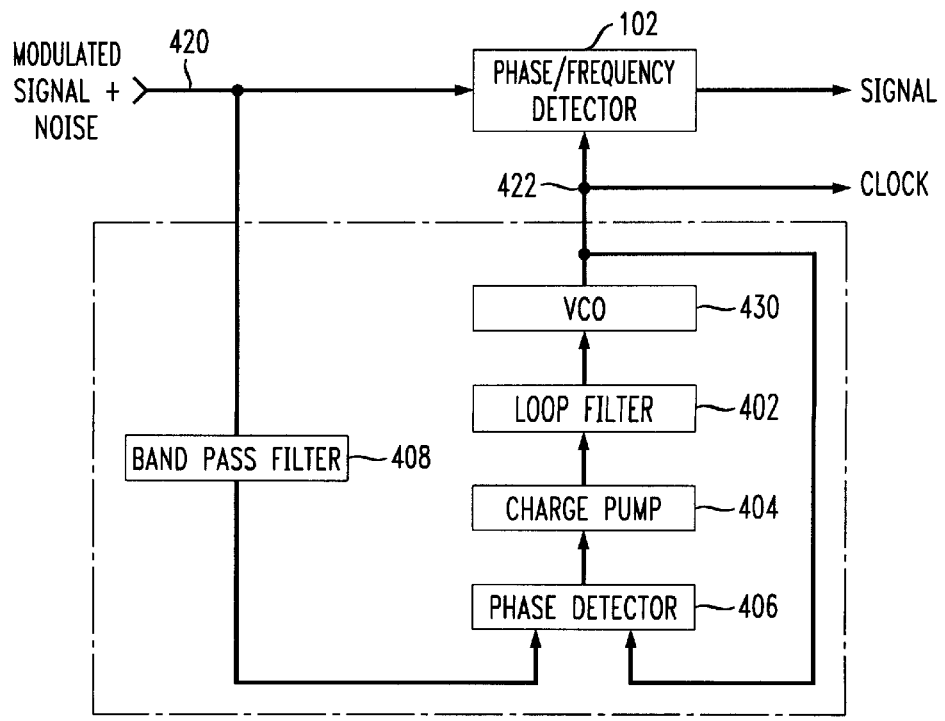
FIG. 5 shows a conventional carrier and clock recovery circuit including a phase-locked loop.

A conventional crystal 516 provides the equivalent of an LC combination to the amplifier 550 to set the fundamental frequency of the whole injection locked oscillator 100. The stability and accuracy requirements of the crystal 516 are chosen the same as for a conventional crystal oscillator device, e.g., as shown in FIG. 4.

Capacitors 502 and 504 are conventionally chosen based on the center operational frequency. Typically, capacitors 502 and 504 range between 10 and 22 picofarads (pF).

A buffer 506 provides small signal gain from an approximately 500 mV logic level to an approximately higher logic level, e.g., 3 volt logic levels.

The inverter 500 in the amplifier 550 is enabled by an enable signal. The externally provided enable signal is active high, and is inverted by an inverter 508.

Significantly, the injection locked oscillator 100 includes a modulation element, e.g., a p-channel metal oxide semiconductor field effect transistor (MOSFET) forming an injection transistor 200 connected between the power source and the output of the inverter 500 of the amplifier 550. The gate of the injection transistor 200 receives the input modulated signal.

In operation, the injection transistor 200 passes power to the output of the inverter 500 to modulate the gain of the amplifier 550 based on the input modulated signal. Thus, the injection transistor 200 modulates the output of the inverter 500 in accordance with the received modulated signal to synchronize the output of the injection locked oscillator 100 with the received carrier frequency.

Figure 3:
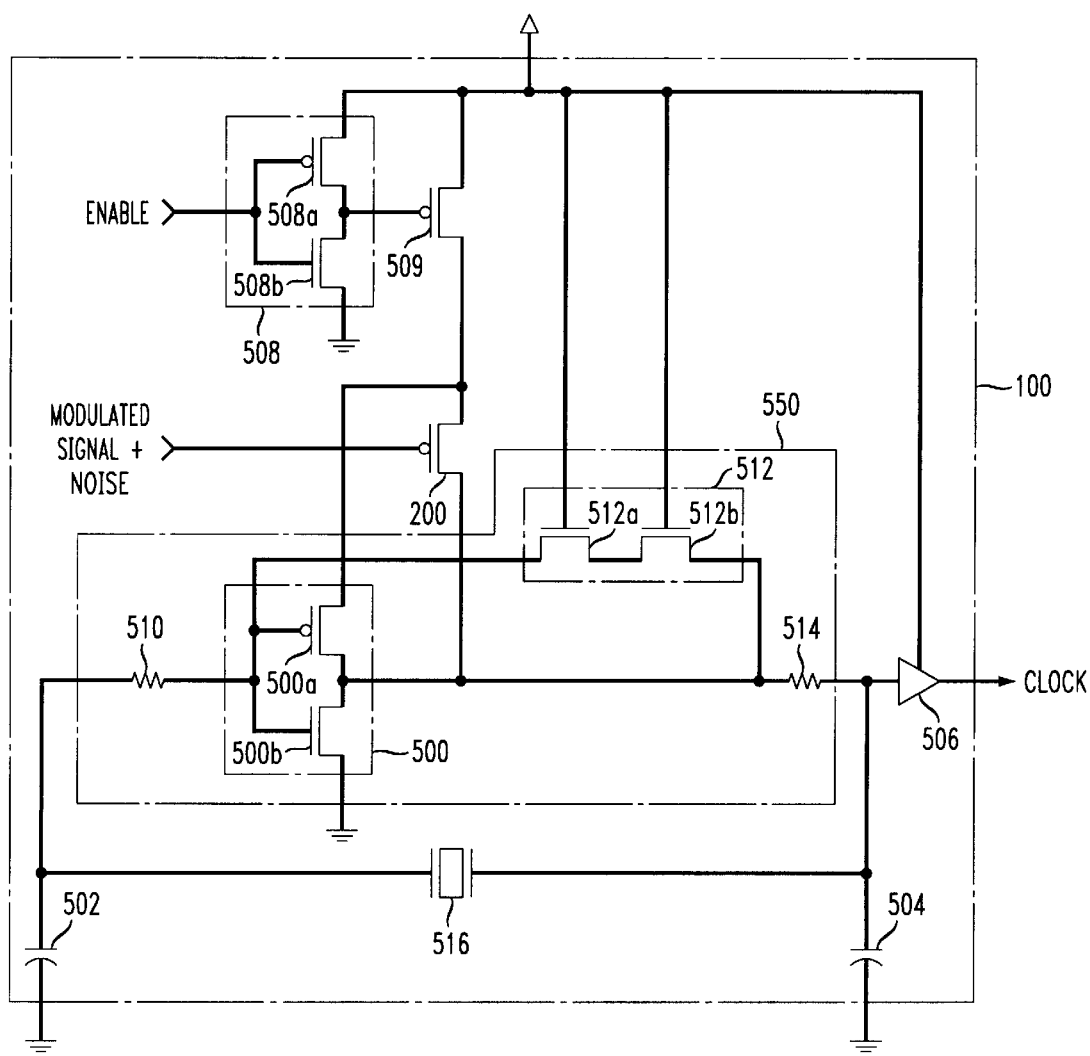
FIG. 3 is an even more detailed schematic diagram of the embodiment of the injection locked oscillator shown in FIG. 2.

FIG. 3 is an even more detailed schematic diagram of the embodiment of the injection locked oscillator shown in FIGS. 1 and 2. FIG. 3 shows the complementary MOSFET transistors 508a, 508b of the enable inverter 508, the output of which is input to the gate of a powering p-channel MOSFET 509. MOSFET 509 provides power to (i.e., enables) the inverter 500 of the amplifier 550. FIG. 3 further shows the complementary MOSFET transistors 500a, 500b of the inverter 500 of the amplifier 550. FIG. 3 shows that in the disclosed embodiment the resistive element 512 is formed by two serially connected n-channel MOSFET transistors having their gates tied to the power source.

In certain circumstances it may be desirable to include conventional electrical isolation or protection circuitry (not shown) on the input or output of the injection locked oscillator 100. Moreover, while the invention is described with respect to certain logic levels and certain transistors of n- or p-types, it is to be understood that the logic levels and transistor types can be inverted and/or exchanged with equivalent technologies in known alternative ways within the principles of the present invention.

The disclosed embodiment of an injection locked oscillator provides low level signal (i.e., approximately −20 dBm) acceptance to provide a desirable tracking range and to allow sufficient accuracy for the performance of phase-only modulation if desired.

The present invention provides a simple injection locked oscillator circuit to recover and synchronize a receiver with a carrier signal without the use of a PLL. The simple structure provides carrier recovery with fast acquisition time, particularly as compared with a carrier recovery circuit including a PLL circuit, and requires less power because of the elimination of the conventional PLL components.

While the invention has been described with reference to the exemplary preferred embodiments thereof, those skilled in the art will be able to make various modifications to the described embodiments of the invention without departing from the true spirit and scope of the invention.

What is claimed is:

1. An injection locked oscillator comprising:
    an inverter stage;
    a crystal connected across said inverter stage to establish a nominal oscillation of said injection locked oscillator; and
    an injection transistor connected to said inverter stage to control a gain of said inverter stage in accordance with an externally input modulated signal.

2. The injection locked oscillator according to claim 1, further comprising:
    a resistive element connected across said inverter stage.

3. The injection locked oscillator according to claim 1, further comprising:
    an enable input to said inverter stage adapted and arranged to allow said inverter stage to oscillate when an enable signal on said enable input is active, and to prevent said inverter stage from oscillating when said enable signal on said enable input is inactive.

4. The injection locked oscillator according to claim 1, further comprising:
    a gain buffer receiving an output of said inverter stage, said gain buffer amplifying a clock signal output from said inverter stage.

5. The injection locked oscillator according to claim 1, further comprising:
    a first resistive element connected between an input to said inverter stage and a first node of said crystal; and
    a second resistive element connected between an output of said inverter stage and a second node of said crystal.

6. The injection locked oscillator according to claim 1, wherein:
    said injection transistor is a field effect transistor.

7. The injection locked oscillator according to claim 6, wherein:
    said field effect transistor is an n-channel MOS field effect transistor.

8. A synchronous carrier recovery circuit comprising:
    a phase/frequency detector having a first input, a second input, and an output, said phase/frequency detector comprising a comparator to compare a frequency and phase of a first signal on said first input to a frequency and phase of a second signal on said second input, and to output a difference between said first signal and said second signal on said output; and
    an injection locked oscillator in communication with an injection signal corresponding to said second signal, said injection locked oscillator including an oscillator to oscillate at a detected carrier frequency, said injection locked oscillator allowing said injection signal to modulate a characteristic of said oscillator.

9. The synchronous carrier recovery circuit according to claim 8, wherein:
    said modulated characteristic of said oscillator is a gain of said oscillator.

10. The synchronous carrier recovery circuit according to claim 8, wherein said oscillator comprises:
    an inverter including a feedback path element for providing a feedback path from an output of said inverter to an input of said inverter.

11. The synchronous carrier recovery circuit according to claim 10, wherein said feedback path element comprises:
    a resistive element.

12. The synchronous carrier recovery circuit according to claim 11, wherein:
    said resistive element comprises at least one transistor.

13. The synchronous carrier recovery circuit according to claim 11, wherein said feedback path element further comprises:
    a crystal.

14. The synchronous carrier recovery circuit according to claim 11, wherein said feedback path element further comprises a series combination of:
    a first resistive element;
    a crystal; and
    a second resistive element.

15. A method of injecting a modulated signal into a circuit, said method comprising:
    providing a crystal oscillator; and
    modulating a gain of said crystal oscillator based on said injected modulated signal.

16. The method of injecting a modulated signal into a circuit according to claim 15, wherein:
    said modulation of said gain is accomplished by modulating a transistor connected between a power supply and an output of an inverter stage in said crystal oscillator.

17. An injection locked oscillator comprising:

oscillator means;

crystal means in parallel with said oscillator means; and gain control means for controlling a gain of said oscillator means in accordance with a modulated input signal.

18. The injection locked oscillator according to claim 17, wherein said gain control means comprises:

injection means, connected to said oscillator means, for modulating said gain of said oscillator means.

19. The injection locked oscillator according to claim 18, wherein:

said injection means comprises a transistor.

20. The injection locked oscillator according to claim 17, wherein said oscillator means comprises:

an inverter.

21. The injection locked oscillator according to claim 20, wherein said oscillator means further comprises:

a feedback circuit between an input to said inverter and an output from said inverter.

\* \* \* \* \*